United States Patent
Hachiya et al.

(10) Patent No.: US 9,552,918 B2
(45) Date of Patent: Jan. 24, 2017

(54) MAGNETIC DEVICE

(71) Applicant: OMRON AUTOMOTIVE ELECTRONICS CO., LTD., Aichi (JP)

(72) Inventors: Koji Hachiya, Hyoto (JP); Tomoyoshi Kobayashi, Aichi (JP); Takashi Yamaguchi, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 0 days.

(21) Appl. No.: 14/777,381

(22) PCT Filed: Mar. 10, 2014

(86) PCT No.: PCT/JP2014/001326
§ 371 (c)(1),
(2) Date: Sep. 15, 2015

(87) PCT Pub. No.: WO2014/141672
PCT Pub. Date: Sep. 18, 2014

(65) Prior Publication Data
US 2016/0035480 A1 Feb. 4, 2016

(30) Foreign Application Priority Data
Mar. 15, 2013 (JP) ................. 2013-052699

(51) Int. Cl.
*H01F 5/00* (2006.01)
*H01F 27/08* (2006.01)
(Continued)

(52) U.S. Cl.
CPC .......... *H01F 27/2876* (2013.01); *H01F 27/22* (2013.01); *H01F 27/2804* (2013.01);
(Continued)

(58) Field of Classification Search
CPC .................. H01F 5/00; H01F 27/28
(Continued)

(56) References Cited

U.S. PATENT DOCUMENTS 5,929,733 A * 7/1999 Anzawa .............. H01F 17/0013
336/200
6,000,128 A 12/1999 Umeno et al.
(Continued)

FOREIGN PATENT DOCUMENTS

JP H07-38262 A 2/1995
JP H07-86755 A 3/1995
(Continued)

OTHER PUBLICATIONS

International Search Report issued in PCT/JP2014/001326 mailed on Jun. 17, 2014 (2 pages).
(Continued)

*Primary Examiner* — Tsz Chan
(74) *Attorney, Agent, or Firm* — Osha Liang LLP

(57) ABSTRACT

Coil patterns are provided in first and second outer surface layers and an inner layer of the board. First and second heat-dissipation patterns are provided in the second outer surface layer. A first thermal inter-layer connection member connects the coil pattern of the first outer surface layer and the first heat-dissipation pattern. A second thermal inter-layer connection member connects the coil pattern of the inner layer and the second heat-dissipation pattern. The coil pattern provided in the second outer surface layer and the first and second heat-dissipation patterns are separated from each other. An area of the second heat-dissipation pattern is larger than an area of the first heat-dissipation pattern.

5 Claims, 4 Drawing Sheets

(a) X-X CROSS-SECTION

(51) Int. Cl.
  *H01F 27/28* (2006.01)
  *H01F 27/22* (2006.01)
  *H01F 37/00* (2006.01)
  *H05K 1/16* (2006.01)
  *H05K 1/02* (2006.01)
  *H05K 3/00* (2006.01)

(52) U.S. Cl.
  CPC ............. *H01F 37/00* (2013.01); *H05K 1/165* (2013.01); *H01F 2027/2819* (2013.01); *H05K 1/0204* (2013.01); *H05K 1/0263* (2013.01); *H05K 3/0061* (2013.01); *H05K 2201/086* (2013.01); *H05K 2201/10409* (2013.01); *H05K 2201/10416* (2013.01)

(58) Field of Classification Search
  USPC .................................................. 336/200, 232
  See application file for complete search history.

(56) References Cited

U.S. PATENT DOCUMENTS

| | | | | |
|---|---|---|---|---|
| 6,466,454 | B1* | 10/2002 | Jitaru | H01F 27/06 336/200 |
| 6,940,384 | B2* | 9/2005 | Hooey | H01F 27/266 336/200 |
| 2005/0270745 | A1 | 12/2005 | Chen et al. | |
| 2007/0296533 | A1* | 12/2007 | Springett | H01F 27/22 336/200 |
| 2010/0164670 | A1* | 7/2010 | Nakahori | H01F 27/2804 336/200 |
| 2010/0237977 | A1* | 9/2010 | Ikezawa | H01F 27/2847 336/232 |
| 2011/0102121 | A1 | 5/2011 | Otsuka et al. | |
| 2012/0112866 | A1 | 5/2012 | Matsumoto | |
| 2013/0278373 | A1* | 10/2013 | Hara | H01F 5/003 336/200 |

FOREIGN PATENT DOCUMENTS

| | | |
|---|---|---|
| JP | H08-69935 A | 3/1996 |
| JP | 2007-059839 A | 3/2007 |
| JP | 2008-502293 A | 1/2008 |
| JP | 2008-177516 A | 7/2008 |
| JP | 2008-205350 A | 9/2008 |
| JP | 2010-153724 A | 7/2010 |
| JP | 2010-161258 A | 7/2010 |
| JP | 2013-062355 A | 4/2013 |
| WO | 2010/026690 A1 | 3/2010 |
| WO | 2011/010491 A1 | 1/2011 |

OTHER PUBLICATIONS

Written Opinion of the International Searching Authority issued in PCT/JP2014/001326 mailed on Jun. 17, 2014 (3 pages).
International Preliminary Report on Patentability from PCT/JP2014/001326 issued on Mar. 26, 2015 (3 pages).

* cited by examiner

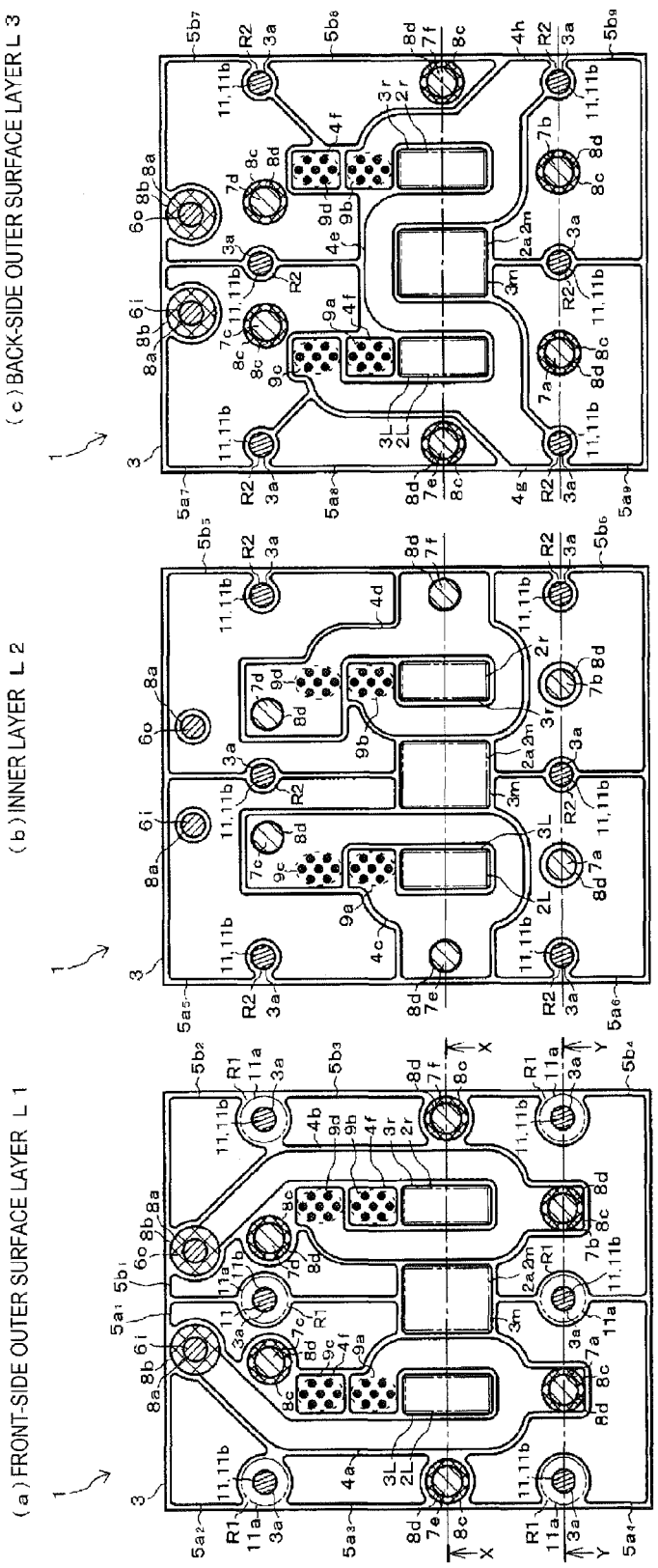

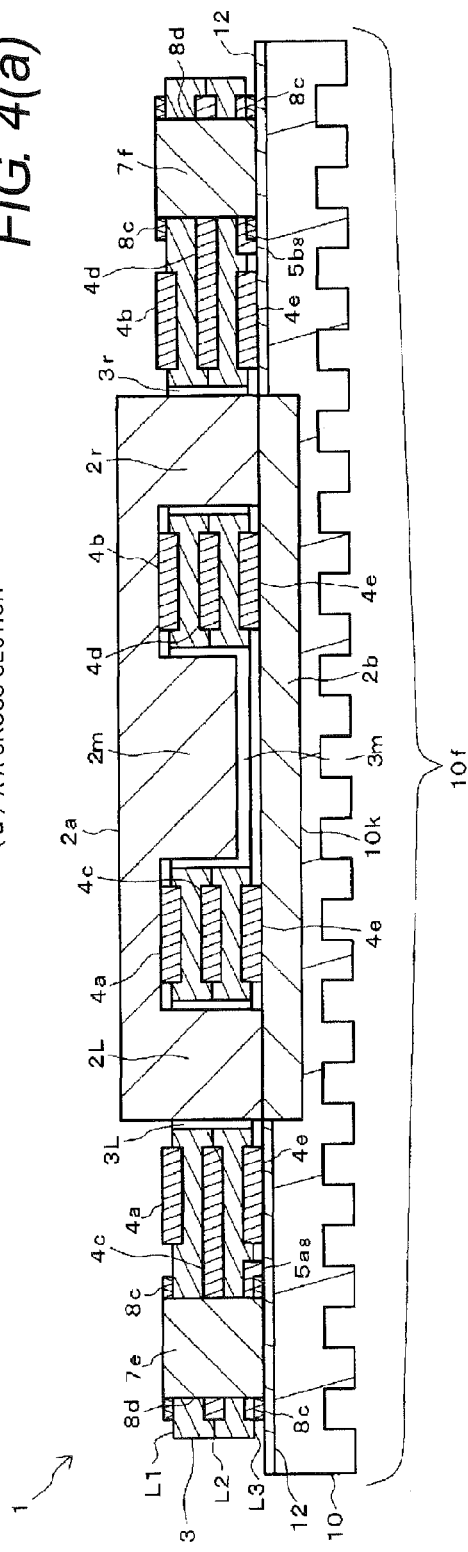

ved by the Invention
MAGNETIC DEVICE

TECHNICAL FIELD

The present invention relates to a magnetic device such as a choke coil and a transformer, which includes a core formed of a magnetic substance and a board having formed coil patterns.

BACKGROUND ART

For example, there is a switching power supply apparatus such as a DC-DC converter, which performs switching so as to convert a DC high voltage into an AC voltage, and then converts the AC voltage into a DC low voltage. A magnetic device such as a choke coil and a transformer is used in the switching power supply apparatus.

For example, Patent Documents 1 to 6 disclose a magnetic device formed of a coil pattern obtained by providing wiring of a coil in a board.

In Patent Documents 1 to 5, a core formed of a magnetic substance is inserted into an opening portion provided in the board. The board is formed of an insulating substance and has a plurality of layers of exposed outer surface layers and an inner layer between the outer surface layers, and the like. The coil pattern is formed on each of the layers so as to be wound around the core. Coil patterns on the different layers are connected to each other by using a through hole and the like. The coil pattern or the through hole is formed of a conductor of copper and the like.

In Patent Document 6, the board is formed of a pair of insulating layers and a magnetic layer provided between the insulating layers. A coil pattern formed of a conductor is formed on the magnetic layer. The coil pattern is obtained by performing winding multiple times in a plate face direction or a thickness direction of the board.

If a current flows in the coil pattern, heat is generated from the coil pattern and thus the temperature of the board becomes greater. As heat-dissipating measures for the board, the coil pattern is formed on almost of the entire area of each of the layers in the board in Patent Document 1. A heat radiator is attached to an end portion of the board.

In Patent Document 3, a portion of the coil pattern on each of layers in the board is widened and a heat-dissipation pattern portion is provided. A downward board protrudes from an upward board and the heat-dissipation pattern portion is provided on a protrusion portion so as to cause the heat-dissipation pattern portion to directly come into contact with an outside air. A position of the heat-dissipation pattern portion (provided in each of the layers) in a face direction is different.

In Patent Document 6, a heat-transfer through conductor which passes through the magnetic layer and a downward insulating layer is provided on an inside of the coil pattern. A heat-dissipation conductor layer connected to the heat-transfer through conductor is provided on a lower surface of the board. The heat-transfer through conductor and the heat-dissipation conductor layer are not connected to the coil pattern.

PRIOR ART DOCUMENT(S)

Patent Documents(s)

Patent Document 1: JP-A-2008-205350
Patent Document 2: JP-A-H07-038262
Patent Document 3: JP-A-H07-086755
Patent Document 4: WO-A1-2010/026690
Patent Document 5: JP-A-H08-069935
Patent Document 6: JP-A-2008-177516

SUMMARY OF THE INVENTION

Problem to be Solved by the Invention

For example, a high current flows in a coil pattern and thus many quantities of heat are generated from the coil pattern in a magnetic device used in a DC-DC converter in which a high current flows. Heat generated in the coil pattern provided in the exposed outer surface layers of the board is dissipated from the front surface of the coil pattern. However, regarding heat generated by the coil pattern provided in the inner layer which is not exposed, dissipation is difficult and filling of the board is easy.

If heat generated by the coil pattern is full and thus the temperature of the board increases, characteristics of the magnetic device may fluctuate or performance may be deteriorated. When other electronic components such as an IC chip are mounted on the same board, the electronic component may be incorrectly operated or may be damaged.

Regarding an object of the present invention, it is desired to easily dissipate heat of the inner layer in the board in which the coil patterns are provided in the outer surface layers and the inner layer, and to improve heat-dissipation performance.

Means for Solving the Invention

According to the present invention, there is provided a magnetic device including: a core which is formed of a magnetic substance; a board which is formed of an insulating substance, which has an opening portion into which the core is inserted, and which comprises two outer surface layers provided on both surfaces and an inner layer provided between the outer surface layers; coil patterns which are formed of a conductor, and which are provided in the outer surface layers and at least one inner layer of the board so as to be wound around the core; a first heat-dissipation pattern which is formed of a conductor, which is provided to correspond to the coil pattern provided in one of the outer surface layers of the board, and which is provided in the other of the outer surface layers; a second heat-dissipation pattern which is formed of a conductor, which is provided to correspond to the coil pattern provided in the inner layer of the board, and which is provided in the other of the outer surface layers; first thermal inter-layer connection means for connecting the coil pattern of the one of the outer surface layers and the first heat-dissipation pattern which correspond to each other; and second thermal inter-layer connection means for connecting the coil pattern of the inner layer and the second heat-dissipation pattern which correspond to each other, wherein the coil pattern provided in the other of the outer surface layers and each of the heat-dissipation patterns are separated from each other, and wherein an area of the second heat-dissipation pattern is larger than an area of the first heat-dissipation pattern.

Thus, it is possible to dissipate heat generated by the coil pattern provided in each of the outer surface layers of the board from the front surface of the coil pattern. It is possible to dissipate the heat from the front surface of the heat-dissipation pattern by causing the first thermal inter-layer connection means to transfer heat generated by the coil pattern in one front surface layer of the board to a first heat-dissipation pattern in the other outer surface layer. It is possible to dissipate the heat from the front surface of the heat-dissipation pattern by causing the second thermal inter-layer connection means to transfer heat generated by the coil pattern in the inner layer of the board to the second heat-dissipation pattern in the other outer surface layer. Since the area of the second heat-dissipation pattern connected to the coil pattern in the inner layer is larger than the area of the first heat-dissipation pattern connected to the coil pattern in the one front surface layer, it is possible to easily dissipate heat generated by the coil pattern in the inner layer from the front surface of the second heat-dissipation pattern. Accordingly, in the board in which the coil patterns are provided in the outer surface layers and the inner layer, heat in the inner layer can be easily dissipated and heat dissipation performance can be improved.

According to the present invention, in the magnetic device, it is preferable that the heat-dissipation patterns are separated from each other.

According to the present invention, the magnetic device may further include electrical inter-layer connection means for connecting the coil patterns provided in different layers of the board with each other.

According to the present invention, the magnetic device may further include a third heat-dissipation pattern which is formed of a conductor provided in the other of the outer surface layers of the board, and which is connected to the coil pattern provided in the other of the outer surface layers. In the magnetic device, the third heat-dissipation pattern and the first and second heat-dissipation patterns may be separated from each other, and an area of the first heat-dissipation pattern may be larger than an area of the third heat-dissipation pattern.

According to the present invention, in the magnetic device, the second heat-dissipation pattern may be provided in the other of the outer surface layers of the board, and a heat radiator may be attached to the other of the outer surface layers.

Advantage of the Invention

According to the present invention, in the board in which the coil patterns are provided in the outer surface layers and the inner layer, heat in the inner layer can be easily dissipated and heat dissipation performance can be improved.

BRIEF DESCRIPTION OF THE DRAWINGS

FIGS. 3(a) to 3(c) are plan views of layers of a board in FIG. 2.

FIGS. 4(a) and 4(b) are cross-sectional views of the magnetic device in FIG. 2.

MODE FOR CARRYING OUT THE INVENTION

Hereinafter, embodiments according to the present invention will be described with reference to the drawings. In each of the drawings, the same parts or the corresponding parts are denoted by the same reference signs.

Figure 1:
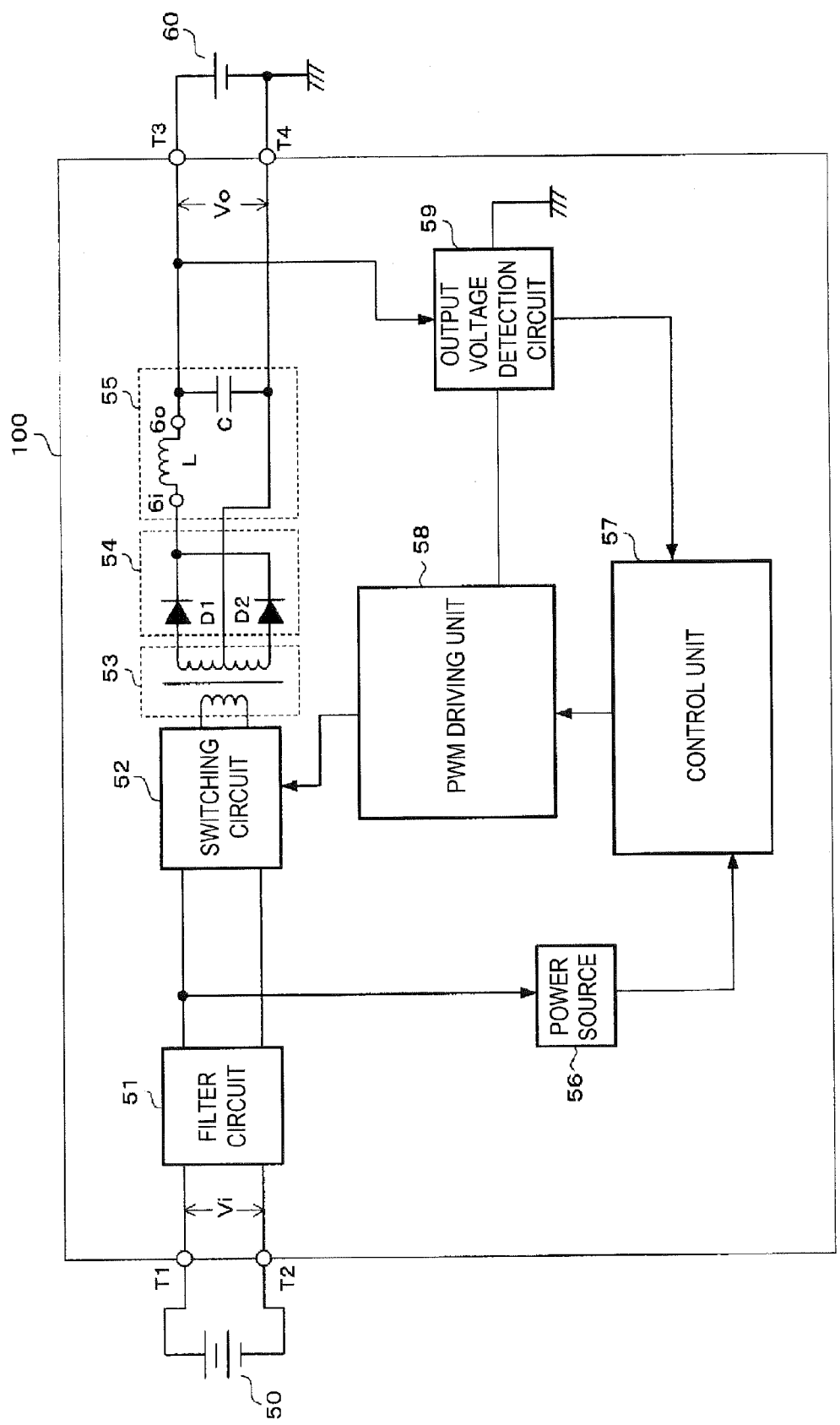
FIG. 1 is a configuration diagram of a switching power supply apparatus.

FIG. 1 is a configuration diagram of a switching power supply apparatus 100. The switching power supply apparatus 100 is a DC-DC converter for an electric vehicle (or hybrid car). The switching power supply apparatus 100 performs switching so as to convert a DC high voltage into an AC voltage, and then converts the AC voltage into a DC low voltage. Details thereof will be described below.

A high voltage battery 50 is connected to input terminals T1 and T2 of the switching power supply apparatus 100. A voltage of the high voltage battery 50 is, for example, in a range of DC 220 V to DC 400 V. A noise is removed from a DC voltage Vi of the high voltage battery 50 input to the input terminals T1 and T2 by a filter circuit 51, and then a result of removal is applied to a switching circuit 52.

The switching circuit 52 is formed of a well-known circuit having, for example, a field effect transistor (FET). In the switching circuit 52, the FET is caused to turn ON and OFF based on a pulse width modulation (PWM) signal from a PWM driving unit 58 and a switching operation is performed on the DC voltage. Thus, the DC voltage is converted into a high-frequency pulse voltage.

The converted pulse voltage is applied to a rectifier circuit 54 through a transformer 53. The rectifier circuit 54 rectifies the pulse voltage by using a pair of diodes D1 and D2. A voltage rectified by the rectifier circuit 54 is input to a smoothing circuit 55. The smoothing circuit 55 smoothes the rectified voltage by a filter action which is performed by a choke coil L and a capacitor C. The smoothed voltage is output to output terminals T3 and T4 as a low DC voltage. A low voltage battery 60 connected to the output terminals T3 and T4 is charged so as to be, for example, DC 12 V by using this DC voltage. A DC voltage of the low voltage battery 60 is supplied to various types of vehicle-mounted electric components (not illustrated).

An output voltage Vo of the smoothing circuit 55 is detected by an output voltage detection circuit 59 and then is output to the PWM driving unit 58. The PWM driving unit 58 calculates a duty ratio of a PWM signal based on the output voltage Vo, and generates the PWM signal in accordance with the duty ratio. The PWM driving unit 58 outputs the generated PWM signal to a gate of the FET in the switching circuit 52. Thus, feedback control for holding the output voltage to be constant is performed.

A control unit 57 controls an operation of the PWM driving unit 58. A power source 56 is connected to an output side of the filter circuit 51. The power source 56 steps down a voltage of the high voltage battery 50 and supplies a power source voltage (for example, DC 12 V) to the control unit 57.

In the switching power supply apparatus 100, magnetic devices 1 which will be described later are used as the choke coil L in the smoothing circuit 55. A high current of, for example, DC 150 A flows in the choke coil L. Terminals 6i and 6o for power input and output are provided at both ends of the choke coil L.

Next, a structure of a magnetic device 1 will be described with reference to FIGS. 2 to 4.

Figure 2:
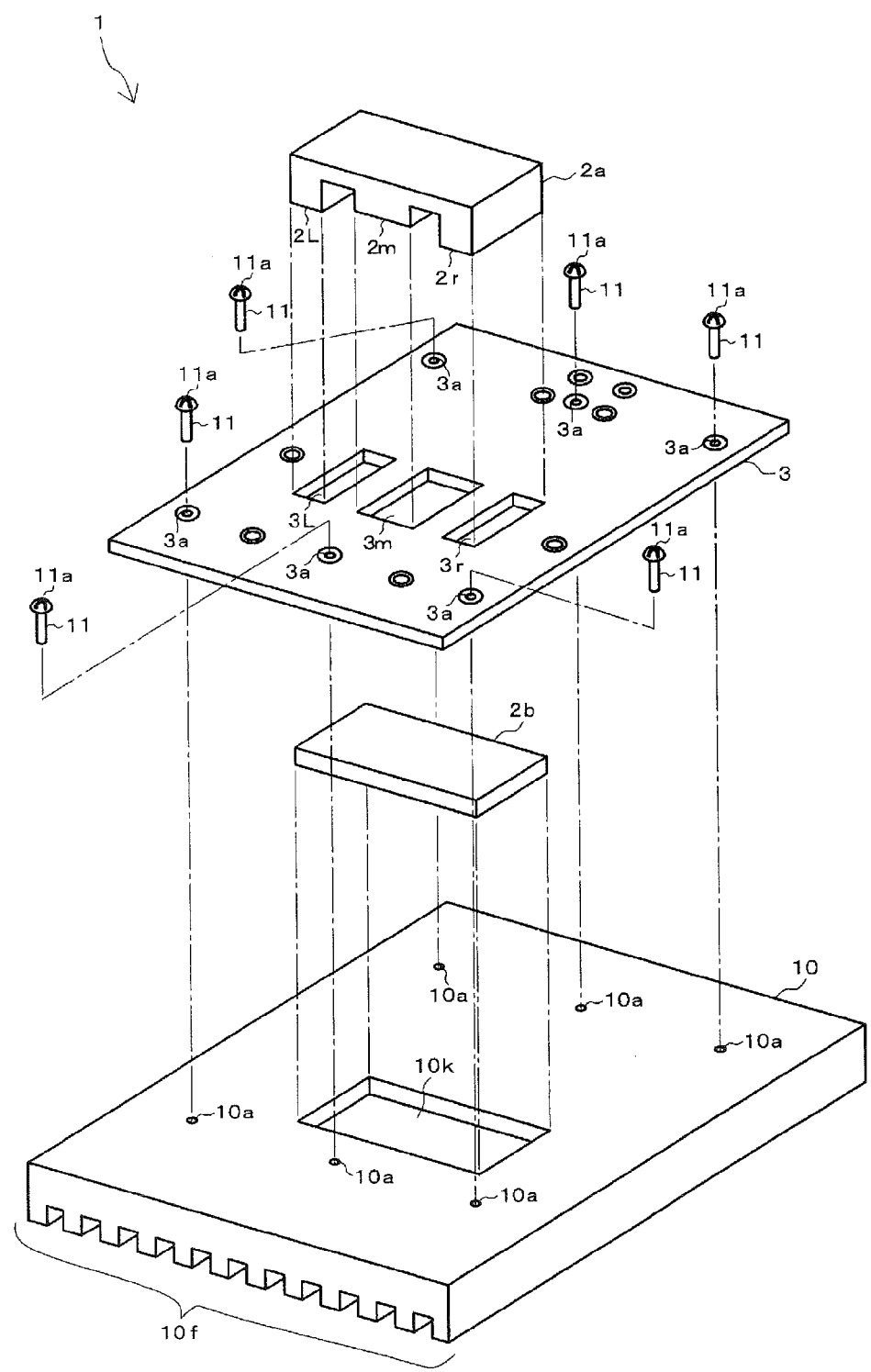
FIG. 2 is an exploded perspective view of a magnetic device according to an embodiment of the present invention.

FIG. 2 is an exploded perspective view of the magnetic device 1. FIGS. 3(a) to 3(c) are plan views of layers in the board 3 of the magnetic device 1. FIG. 4 is a cross-sectional view of the magnetic device 1; FIG. 4(a) illustrates an X-X cross-section in FIGS. 3(a) to 3(c), and FIG. 4(b) illustrates a Y-Y cross-section in FIGS. 3(a) to 3(c).

As illustrated in FIG. 2, cores 2a and 2b are configured by a pair of two, that is, an upper core 2a and a lower core 2b. The upper core 2a has an E-shape and the lower core 2b has an I-shape. The cores 2a and 2b are formed of a magnetic substance such as ferrite and an amorphous metal.

The upper core 2a has three convex portions 2m, 2L, and 2r so as to protrude downwardly. A protrusion amount of the right and left convex portions 2L and 2r is more than a protrusion amount of the center convex portion 2m.

As illustrated in FIG. 4(a), lower ends of the right and left convex portions 2L and 2r of the upper core 2a adhere to an upper surface of the lower core 2b and thus the cores 2a and 2b are combined. Since DC superimposition characteristics are strengthened in this state, a gap of a predetermined size is provided between the convex portion 2m of the upper core 2a and the upper surface of the lower core 2b. Thus, even when a high current flows in the magnetic device 1 (choke coil L), it is possible to realize a predetermined inductance. The cores 2a and 2b are fixed to each other by fixation means (not illustrated) such as a screw and metal fittings.

The lower core 2b is fitted into a concave portion 10k (FIG. 2) provided on an upside of the heat sink 10. A fin 10f is provided on a downside of the heat sink 10. The heat sink 10 is made of metal and is an example of a "heat radiator" according to the present invention.

The board 3 is formed of a thick copper foil board obtained by forming a pattern on each layer of a thin plate-like base with a thick copper foil (conductor). The thin plate-like base is formed of an insulating substance. In this embodiment, other electronic components or other circuits are not provided on the board 3. However, when the magnetic device 1 is practically used in the switching power supply apparatus 100 in FIG. 1, other electronic components or other circuits are provided on the same board larger than the board 3, in addition to the magnetic device 1 and the switching power supply apparatus 100.

A front-side outer surface layer L1 as illustrated in FIG. 3(a) is provided on a front surface (upper surface in FIGS. 2 and 4(a) and 4(b)) of the board 3. A back-side outer surface layer L3 as illustrated in FIG. 3(c) is provided on a back surface (lower surface in FIGS. 2 and 4(a) and 4(b)) of the board 3. As illustrated in FIGS. 4(a) and 4(b), an inner layer L2 as illustrated in FIG. 3(b) is provided between both of the outer surface layers L1 and L3. That is, the board 3 has three layers L1, L2, and L3 of the two outer surface layers L1 and L3, and the one inner layer L2.

Opening portions 3m, 3L, and 3r is provided in the board 3. Each of the opening portions 3m, 3L, and 3r is formed by a rectangular through hole. As illustrated in FIGS. 2 to 4(a), the convex portions 2m, 2L, and 2r of the core 2a are respectively inserted into the opening portions 3m, 3L, and 3r.

A plurality of through holes 3a having a small circular shape is provided in the board 3. As illustrated in FIGS. 2 and 4(b), screws 11 are respectively inserted into the through holes 3a. A back surface (back-side outer surface layer L3) of the board 3 is caused to face an upper surface (surface opposite to the fin 10f) of the heat sink 10. The screws 11 is respectively caused to pass through the through holes 3a from a front surface (front-side outer surface layer L1) of the board 3 and are screwed with screw holes 10a of the heat sink 10. Thus, as illustrated in FIGS. 4(a) and 4(b), the heat sink 10 is attached to the back-side outer surface layer L3 side of the board 3 in a proximity state.

An insulating sheet 12 having a heat transfer property is interposed between the board 3 and the heat sink 10. Since the insulating sheet 12 has flexibility, the insulating sheet 12 adheres to the board 3 or the heat sink 10 without a gap.

As illustrated in FIGS. 3(a) to 3(c), conductors of through holes 8a, 8d, 9a to 9d, pads 8b and 8c, the terminals 6i and 6o, patterns 4a to 4h, $5a_1$ to $5a_9$, and $5b_1$ to $5b_9$, and pins 7a to 7f are provided in the board 3. The through holes 8a, 8d, and 9a to 9d connect patterns 4a to 4f, $5a_7$ to $5a_9$, and $5b_7$ to $5b_9$ in different layers L1, L2, and L3 with each other.

In detail, the through hole 8a connects the patterns 4a and 4b in the front-side outer surface layer L1 with other layers L2 and L3. The through hole 8d connects the front-side outer surface layer L1 with other layers L2 and L3, to connect the patterns 4a and 4b in the front-side outer surface layer L1 with the patterns $5a_9$ and $5b_9$ in the back-side outer surface layer L3, or to connect the patterns 4c and 4d in the inner layer L2 with the patterns $5a_7$, $5a_8$, $5b_7$, and $5b_8$ in the back-side outer surface layer L3. The through holes 9a and 9d connect the patterns 4a and 4b in the front-side outer surface layer L1 with the patterns 4c and 4d in the inner layer L2. The through holes 9b and 9c connect the patterns 4c and 4d in the inner layer L2 with the pattern 4e in the back-side outer surface layer L3.

The terminal 6i for inputting power is buried in one of a pair of through holes 8a having a large diameter, and the terminal 6o for outputting power is buried in another of the pair of through holes 8a. The terminals 6i and 6o are formed of a copper pin. Pads 8b formed of a copper foil are provided around the terminals 6i and 6o in the front-side outer surface layer L1 and the back-side outer surface layer L3. Copper plating is performed on front surfaces of the terminals 6i and 6o or the pads 8b. Lower ends of the terminals 6i and 6o come into contact with the insulating sheet 12 (not illustrated).

Coil patterns 4a to 4e and heat-dissipation patterns 4g, 4h, $5a_4$ to $5a_9$ and $5b_1$ to $5b_9$ are provided in the layers L1, L2, and L3 of the board 3. The patterns 4a to 4e, 4g, 4h, $5a_1$ to $5a_9$, and $5b_1$ to $5b_9$ are formed of copper foils. Insulating processing is performed on front surfaces of the patterns 4a, 4b, $5a_1$ to $5a_4$, and $5b_1$ to $5b_4$ in the front-side outer surface layer L1.

The width, the thickness, or the cross-sectional area of the coil patterns 4a to 4e is set to achieve predetermined performance of a coil and to suppress heat quantities in the coil patterns 4a to 4e up to a certain extent and enable heat dissipation even when a predetermined high current (for example, DC 150 A) flows.

As illustrated in FIG. 3(a), the coil pattern 4a is wound once in four directions of surroundings of the convex portion 2L in the front-side outer surface layer L1. The coil pattern 4b is wound once in four directions of surroundings of the convex portion 2r.

As illustrated in FIG. 3(b), the coil pattern 4c is wound once in the four directions of the surroundings of the convex portion 2L in the inner layer L2. The coil pattern 4d is wound once in the four directions of the surroundings of the convex portion 2r.

As illustrated in FIG. 3(c), the coil pattern 4e in the back-side outer surface layer L3 is wound once in the four directions of the surroundings of the convex portion 2L, is wound once in the three directions of the surroundings of the convex portion 2m, and then is wound once in the four directions of the surroundings of the convex portion 2r.

One end of the coil pattern 4a and one end of the coil pattern 4c are connected to each other by using the through hole 9a. Another end of the coil pattern 4c and one end of the coil pattern 4e are connected to each other by using the through hole 9c. Another end of the coil pattern 4e and one end of the coil pattern 4d are connected to each other by using the through hole 9b. Another end of the coil pattern 4d and one end of the coil pattern 4b are connected to each other by using the through hole group 9d.

Copper plating is performed on the front surface of each of through holes 9a to 9d. Copper and the like may be buried in each of the through holes 9a to 9d. The through holes 9a to 9d are an example of "electrical inter-layer connection means" according to the present invention.

Small patterns $4f$ are provided in the surrounding of the through holes $9b$ and $9c$ in the front-side outer surface layer L1 and the surrounding of the through holes $9a$ and $9d$ in the back-side outer surface layer L3 in order to easily form the through holes $9a$ to $9d$. The through holes $9a$ to $9d$ and the small patterns $4f$ are respectively connected to each other. The small patterns $4f$ are formed of a copper foil. Insulating processing is performed on front surfaces of the small patterns $4f$ in the front-side outer surface layer L1.

Another end of the coil pattern $4a$ is connected to the terminal $6i$ through the pad $8b$. Another end of the coil pattern $4b$ is connected to the terminal $6o$ through the pad $8b$.

With the above descriptions, after the coil patterns $4a$ to $4e$ of the board 3 are wound firstly around the convex portion 2L from the terminal $6i$ which is a starting point, the coil patterns $4a$ to $4e$ of the board 3 are connected to the inner layer L2 through the through hole $9a$, in the front-side outer surface layer L1. Then, after the coil patterns $4a$ to $4e$ are wound secondly around the convex portion 2L in the inner layer L2, the coil patterns $4a$ to $4e$ of the board 3 are connected to the back-side outer surface layer L3 through the through hole $9c$.

Then, after the coil patterns $4a$ to $4e$ are wound thirdly around the convex portion 2L and wound fourthly around the convex portion $2r$ through a circumference of the convex portion $2m$, the coil patterns $4a$ to $4e$ are connected to the inner layer L2 through the through hole $9b$, in the back-side outer surface layer L3. Then, after the coil patterns $4a$ to $4e$ are wound fifthly around the convex portion $2r$ in the inner layer L2, the coil patterns $4a$ to $4e$ are connected to the front-side outer surface layer L1 through the through hole $9d$. After the coil patterns $4a$ to $4e$ are wound sixthly around the convex portion $2r$ in the front-side outer surface layer L1, the coil patterns $4a$ to $4e$ are connected to the terminal $6o$ which is an ending point.

As described above, a current flowing in the magnetic device 1 flows in an order of the terminal $6i$, the coil pattern $4a$, the through hole $9a$, the coil pattern $4c$, the through hole $9c$, the coil pattern $4e$, the through hole $9b$, the coil pattern $4d$, the through hole $9d$, the coil pattern $4b$, and the terminal $6o$.

The heat-dissipation patterns $5a_1$ to $5a_9$ and $5b_1$ to $5b_9$ are formed in certain free spaces around the coil patterns $4a$ to $4e$ or the small patterns $4f$ in the layers L1 to L3, so as to be separate from the patterns $4a$ to $4e$ and $4f$. The heat-dissipation patterns $5a_1$ to $5a_9$ and $5a_i$ to $5a_9$ are separated from each other. That is, each of the heat-dissipation patterns $5a_1$ to $5a_9$ and $5b_1$ to $5b_9$ is separated from the coil patterns $4a$ to $4e$, the small pattern $4f$, and other heat-dissipation patterns $5a_1$ to $5a_9$ and $5b_1$ to $5b_9$.

As illustrated in FIG. 3(c), in the back-side outer surface layer L3, the heat-dissipation patterns $4g$ and $4h$ are provided so as to be integrated with the coil pattern $4e$ in the back-side outer surface layer L3. That is, the heat-dissipation patterns $4g$ and $4h$ are connected to the coil pattern $4e$. The heat-dissipation patterns $4g$ and $4h$ are separated from the heat-dissipation patterns $5a_7$ to $5a_9$ and $5b_7$ to $5b_9$.

As illustrated in FIGS. 3(a) to 3(c), the pads $8b$, the terminals $6i$ and $6o$, the through hole $3a$, and the screws 11 are insulated from the heat-dissipation patterns $5a_1$ to $5a_9$, $5b_1$ to $5b_9$, $4g$, and $4h$. An insulating area R1 around the through hole $3a$ in the front-side outer surface layer L1 is wider than an insulating area R2 (area of no conductor) around the through hole $3a$ in the inner layer L2 or the back-side outer surface layer L3, in order to cause a head portion $11a$ of the screw 11 having a diameter larger than that of a shaft portion $11b$ thereof to be disposed on the front surface side of the board 3.

Heat-dissipation pins $7a$ to $7f$ are respectively buried into a plurality of through holes $8d$ having a large diameter. The heat-dissipation pins $7a$ to $7f$ are formed of copper pins. The pads $8c$ formed of a copper foil are provided around the heat-dissipation pins $7a$ to $7f$ in the front-side outer surface layer L1 and the back-side outer surface layer L3. Copper plating is performed on front surfaces of the heat-dissipation pins $7a$ to $7f$ or the pads $8c$. Lower ends of the heat-dissipation pins $7a$ to $7f$ come into contact with the insulating sheet 12 (see FIG. 4(b)).

As illustrated in FIG. 3(a), the heat-dissipation pin $7a$, the pad $8c$ around the heat-dissipation pin $7a$, and the through hole $8d$ are connected to the coil pattern $4a$ in the front-side outer surface layer L1. The heat-dissipation pin $7b$, the pad $8c$ around the heat-dissipation pin $7b$, and the through hole $8d$ are connected to the coil pattern $4b$. Other heat-dissipation pins $7c$ to $7f$, the pads $8c$ around the heat-dissipation pins $7c$ to $7f$, and the through holes $8d$ are insulated from the heat-dissipation patterns $5a_1$ to $5a_4$ and $5b_1$ to $5b_4$, the coil patterns $4a$ and $4b$, and the small patterns $4f$. The coil patterns $4a$ and $4b$ and the small pattern $4f$ are insulated from the heat-dissipation patterns $5a_1$ to $5a_4$ and $5b_1$ to $5b_4$.

As illustrated in FIG. 3(b), the heat-dissipation pins $7c$ and $7e$, and the through holes $8d$ around the heat-dissipation pins $7c$ and $7e$ are connected to the coil pattern $4c$ in the inner layer L2. The heat-dissipation pins $7d$ and $7f$, and the through holes $8d$ around the heat-dissipation pins $7d$ and $7f$ are connected to the coil pattern $4d$. Other heat-dissipation pins $7a$ and $7b$, and the through holes $8d$ around the heat-dissipation pins $7a$ and $7b$ are insulated from the heat-dissipation patterns $5a_5$, $5a_6$, $5b_5$, and $5b_6$, and the coil patterns $4c$ and $4d$. The coil patterns $4c$ and $4d$ are insulated from the heat-dissipation patterns $5a_5$, $5a_6$, $5b_5$, and $5b_6$.

As illustrated in FIG. 3(c), a heat-dissipation pattern $5a_9$ is provided in the back-side outer surface layer L3 so as to correspond to the coil pattern $4a$ in the front-side outer surface layer L1. A heat-dissipation pattern $5b_9$ is provided in the back-side outer surface layer L3 so as to correspond to the coil pattern $4b$. Heat-dissipation patterns $5a_7$ and $5a_8$ are provided so as to correspond to the coil pattern $4c$ in the inner layer L2. Heat-dissipation patterns $5b_7$ and $5b_8$ are provided so as to correspond to the coil pattern $4d$. The heat-dissipation patterns $5a_9$ and $5b_9$ are an example of the "first heat-dissipation pattern" according to the present invention. The heat-dissipation patterns $5a_7$, $5a_8$, $5b_7$ and $5b_8$ are an example of the "second heat-dissipation pattern" according to the present invention.

The heat-dissipation pin $7c$, the pad $8c$ around the heat-dissipation pin $7c$, and the through hole $8d$ are connected to the heat-dissipation pattern $5a_7$ in the back-side outer surface layer L3. The heat-dissipation pin $7e$, the pad $8c$ around the heat-dissipation pin $7e$, and the through hole $8d$ are connected to the heat-dissipation pattern $5a_8$. The heat-dissipation pin $7a$, the pad $8c$ around the heat-dissipation pin $7a$, and the through hole $8d$ are connected to the heat-dissipation pattern $5a_9$.

The heat-dissipation pin $7d$, the pad $8c$ around the heat-dissipation pin $7d$, and the through hole $8d$ are connected to the heat-dissipation pattern $5b_7$ in the back-side outer surface layer L3. The heat-dissipation pin $7f$, the pad $8c$ around the heat-dissipation pin $7f$, and the through hole $8d$ are connected to the heat-dissipation pattern $5b_8$. The heat-dissipation pin 7b, the pad 8c around the heat-dissipation pin 7b, and the through hole 8d are connected to the heat-dissipation pattern $5b_9$.

The coil pattern 4e and the small pattern 4f are insulated from the heat-dissipation patterns $5a_7$ to $5a_9$ and $5b_7$ to $5b_9$ in the back-side outer surface layer L3. The coil pattern 4e and the small pattern 4f are insulated from the heat-dissipation pins 7a to 7f, the pads 8c, and the through holes 8d.

With the above descriptions, the coil pattern 4a in the front-side outer surface layer L1 and the heat-dissipation pattern $5a_9$ in the back-side outer surface layer L3 are connected to each other by using the heat-dissipation pin 7a, the pad 8c around the heat-dissipation pin 7a, and the through hole 8d. The coil pattern 4b in the front-side outer surface layer L1 and the heat-dissipation pattern $5b_9$ in the back-side outer surface layer L3 are connected to each other by using the heat-dissipation pin 7b, the pad 8c around the heat-dissipation pin 7b, and the through hole 8d. That is, the coil patterns 4a and 4b in the front-side outer surface layer L1 are respectively connected to the corresponding heat-dissipation patterns $5a_9$ and $5b_9$ at one place in the back-side outer surface layer L3. The heat-dissipation pins 7a and 7b, the pads 8c around the heat-dissipation pins 7a and 7b, and the through holes 8d are an example of "first thermal inter-layer connection means" according to the present invention.

The coil pattern 4c in the inner layer L2 and the heat-dissipation patterns $5a_7$ and $5a_8$ in the back-side outer surface layer L3 are connected to each other by using the heat-dissipation pins 7c and 7e, the pads 8c around the heat-dissipation pins 7c and 7e, and the through holes 8d. The coil pattern 4d in the inner layer L2 and the heat-dissipation patterns $5b_7$ and $5b_8$ in the back-side outer surface layer L3 are connected to each other by using the heat-dissipation pins 7d and 7f, the pads 8c around the heat-dissipation pins 7d and 7f, and the through holes 8d. That is, the coil patterns 4c and 4d in the inner layer L2 are respectively connected to the corresponding heat-dissipation patterns $5a_7$, $5a_8$, $5b_7$, and $5b_8$ at two places in the back-side outer surface layer L3. The heat-dissipation pins 7c to 7f, the pads 8c around the heat-dissipation pins 7c to 7f, and the through holes 8d are an example of "second thermal inter-layer connection means" according to the present invention.

The total area of the heat-dissipation patterns $5a_7$, $5a_8$, $5b_7$, and $5b_8$ in the back-side outer surface layer L3, which are connected to the coil patterns 4c and 4d in the inner layer L2 is larger than the total area of the heat-dissipation patterns $5a_9$ and $5b_9$ in the back-side outer surface layer L3, which are connected to the coil patterns 4a and 4b in the front-side outer surface layer L1.

The total area of the heat-dissipation patterns $5a_9$ and $5b_9$ in the back-side outer surface layer L3 is larger than the total area of the heat-dissipation patterns 4g and 4h connected to the coil pattern 4e in the back-side outer surface layer L3.

Since a high current flows in the coil patterns 4a to 4e, the coil patterns 4a to 4e function as a heat generation source, and thus the temperature of the board 3 increases.

In the front-side outer surface layer L1, heat of the board 3 is diffused to the heat-dissipation patterns $5a_1$ to $5a_4$ and $5b_1$ to $5b_4$, and is dissipated on the front surfaces of the conductors such as the patterns 4a, 4b, 4f, $5a_1$ to $5a_4$, and $5b_1$ to $5b_4$. Heat of the board 3 is transferred to the conductors passing through the board 3, such as the heat-dissipation pins 7a to 7f, the through holes 8d, 8a, and 9a to 9d, and thus is dissipated through the insulating sheet 12 by the heat sink 10. The through holes 9a to 9d function as thermal vias. Particularly, heat generated by the coil patterns 4a and 4b is transferred to the heat-dissipation pins 7a and 7b and the like and is diffused to the heat-dissipation patterns $5a_9$ and $5b_9$ in the back-side outer surface layer L3. Thus, the heat is dissipated from front surfaces of the heat-dissipation patterns $5a_9$ and $5b_9$ or lower surfaces of the heat-dissipation pins 7a and 7b, through the insulating sheet 12 by the heat sink 10.

In the inner layer L2, heat of the board 3 is diffused to the heat-dissipation patterns $5a_5$, $5a_6$, $5b_5$, and $5b_6$, is transferred to the conductors passing through the board 3, such as the heat-dissipation pins 7a to 7f, the through holes 8d, and 9a to 9d, and thus the heat is dissipated through the insulating sheet 12 by the heat sink 10. Particularly, heat generated by the coil patterns 4c and 4d is transferred to the heat-dissipation pins 7c to 7f and the like and is diffused to the heat-dissipation patterns $5a_7$, $5a_8$, $5b_7$, and $5b_8$ in the back-side outer surface layer L3. Thus, the heat is dissipated from front surfaces of the heat-dissipation patterns $5a_7$, $5a_8$, $5b_7$, and $5b_8$ or lower surfaces of the heat-dissipation pins 7c to 7f, through the insulating sheet 12 by the heat sink 10.

In the back-side outer surface layer L3, heat of the board 3 is diffused to the heat-dissipation patterns $5a_7$ to $5a_9$ and $5b_7$ to $5b_9$, and is dissipated from front surfaces of the conductors such as the patterns 4e, 4f, $5a_7$ to $5a_9$, and $5b_7$ to $5b_9$, through the insulating sheet 12 by the heat sink 10. Particularly, heat generated by the coil pattern 4e is dissipated from the front surface of the coil pattern 4e through the insulating sheet 12 by the heat sink 10.

According to the embodiment, it is possible to dissipate heat generated by the coil patterns 4a and 4b in the front-side outer surface layer L1 of the board 3 from the front surfaces of the patterns 4a and 4b. In addition, the heat generated by the coil patterns 4a and 4b in the front-side outer surface layer L1 of the board 3 is transferred to the heat-dissipation patterns $5a_9$ and $5b_9$ in the back-side outer surface layer L3 by using the heat-dissipation pins 7a and 7b, and thus it is possible to dissipate the heat from the front surfaces of the patterns $5a_9$ and $5b_9$ through the insulating sheet 12 by the heat sink 10. The heat generated by the coil pattern 4e in the back-side outer surface layer L3 is diffused to the heat-dissipation patterns 4g and 4h, and thus it is possible to dissipate the heat from the front surface of the patterns 4e, 4g, and 4h through the insulating sheet 12 by the heat sink 10.

Heat generated by the coil patterns 4c and 4d in the inner layer L2 is transferred to the heat-dissipation patterns $5a_7$, $5a_8$, $5b_7$, and $5b_8$ in the back-side outer surface layer L3 by using the heat-dissipation pins 7c to 7f and the like, and thus it is possible to dissipate the heat from the front surface of the heat-dissipation patterns $5a_7$, $5a_8$, $5b_7$, and $5b_8$ through the insulating sheet 12 by the heat sink 10. In the back-side outer surface layer L3, since the total area of the heat-dissipation patterns $5a_7$, $5a_8$, $5b_7$, and $5b_8$ is larger than the total area of the heat-dissipation patterns $5a_9$ and $5b_9$, it is possible to easily dissipate heat generated by the coil patterns 4c and 4d in the inner layer L2 from the front surfaces of the heat-dissipation patterns $5a_7$, $5a_8$, $5b_7$, and $5b_8$ through the insulating sheet 12 by the heat sink 10.

Accordingly, heat in the inner layer L2 can be easily dissipated in the board 3 in which the coil patterns 4a to 4e are provided in the outer surface layers L1 and L3, and the inner layer L2, and heat dissipation performance can be improved.

In the back-side outer surface layer L3, the heat-dissipation patterns $5a_7$ to $5a_9$, $5b_7$ to $5b_9$, 4g, and 4h are separated from each other. The heat-dissipation patterns $5a_7$ to $5a_9$ and $5b_7$ to $5b_9$ are separated from the coil pattern 4e. The coil patterns $4a$ to $4e$ in the different layers L1 to L3 are connected to each other by using the through holes $9a$ to $9d$. The coil patterns $4a$ to $4d$ are connected with the heat-dissipation patterns $5a_7$ to $5a_9$ and $5b_7$ to $5b_9$ by using the heat-dissipation pins $7a$ to $7f$, and the like. For this reason, it is possible to ensure a heat-dissipation path of heat generated by the patterns $4a$ to $4e$ without an influence on an electrification path of the coil patterns $4a$ to $4e$.

Heat generated by the coil patterns $4a$ to $4d$ in the front-side outer surface layer L1 and the inner layer L2 of the board 3 is transferred to the heat sink 10 through a different heat-dissipation path of the heat-dissipation pins $7a$ to $7f$, or the heat-dissipation patterns $5a_7$ to $5a_9$ and $5b_7$ to $5b_9$ in the back-side outer surface layer L3, and thus it is possible to dissipate the heat with high efficiency.

Since the total area of the heat-dissipation patterns $5a_9$ and $5b_9$ is larger than the total area of the heat-dissipation patterns $4g$ and $4h$, heat generated by the coil patterns $4a$ and $4b$ in the front-side outer surface layer L1 is transferred by using the heat-dissipation pins $7a$ and $7b$, and thus it is possible to easily dissipate the heat from the front surfaces of the heat-dissipation patterns $5a_9$ and $5b_9$ through the insulating sheet 12 by the heat sink 10.

In the present invention, various embodiments can be employed in addition to the above descriptions. For example, in the above embodiments, an example in which the coil patterns coil patterns $4a$ to $4e$ are formed in the layers L1 to L3 of the board 3 having the two outer surface layers L1 and L3, and the one inner layer L2 is described. However, the present invention is not limited to only this example. In a board having two outer surface layers and inner layers of two or more, coil patterns may be formed in each of the outer surface layers, and at least one inner layer.

In the above embodiment, an example in which the coil patterns $4a$ to $4e$ are formed in the board 3 so as to be wound around the three convex portions $2m$, 2L, and $2r$ of the core $2a$ is described. However, the present invention is not limited to only this example. The coil patterns may be wound around at least one convex portion of the core.

In the above embodiment, an example in which the heat-dissipation patterns $5a_7$ to $5a_9$ and $5b_7$ to $5b_9$ are provided in the back-side outer surface layer L3 of the board 3 so as to correspond to the coil patterns $4a$ to $4d$ in other layers L1 and L2 is described. However, the present invention is not limited to only this example. In addition, heat-dissipation patterns may be provided in the front-side outer surface layer so as to correspond to coil patterns in the back-side outer surface layer of a board. A heat-dissipation pattern corresponding to a coil pattern in the inner layer may be provided in the front-side outer surface layer or may be provided in both of the front-side outer surface layer and the back-side outer surface layer.

In the above embodiment, an example in which the heat-dissipation patterns $4g$ and $4h$ connected to the coil pattern $4e$ are provided in the back-side outer surface layer L3 of the board is described. However, the present invention is not limited to only this example. In addition, the heat-dissipation patterns $4g$ and $4h$ in the back-side outer surface layer L3 may be omitted and other heat-dissipation patterns $5a_8$, $5a_9$, $5b_8$, and $5b_9$ may be expanded. A heat-dissipation pattern connected to a coil pattern in the layer may be provided in the front-side outer surface layer of the board or a heat-dissipation pattern connected to a coil pattern in the layer may be provided in the inner layer of the board.

In the above embodiment, an example in which the coil patterns $4a$ to $4d$ and the heat-dissipation patterns $5a_7$ to $5a_9$ and $5b_7$ to $5b_9$ which correspond to each other in different layers L1 to L3 are connected by using the heat-dissipation pins $7a$ to $7f$, the pads $8c$, and the through holes $8d$ is described. However, the present invention is not limited to only this example. In addition, the coil patterns and the heat-dissipation patterns which correspond to each other in different layers may be connected to each other by at least one thermal inter-layer connection means of, for example, the terminals, the pins, and the through holes, and the like.

In the above embodiment, an example in which the coil patterns $4a$ to $4e$ in the different layers L1 to L3 are connected to each other by using the through holes $9a$ to $9d$ is described. However, the present invention is not limited to only this example. In addition, the coil patterns in the different layers may be connected to each other by, for example, using another electrical inter-layer connection means such as the terminal and the pin.

In the above embodiments, an example of using the heat sink 10 as a heat radiator is described. However, the present invention is not limited to only this example. In addition, an air-cooled heat radiator, a water-cooled heat radiator, a heat radiator using a coolant, and the like may be used. For example, a heat radiator formed of resin having high thermal conductivity may be used in addition to a metallic heat radiator. In this case, the insulating sheet 12 is not necessarily provided between the heat radiator and the board, and thus it is possible to omit the insulating sheet 12. Heat radiators may be respectively provided in both of the outer surface layers of the board, or a heat radiator may be omitted.

In the above embodiments, an example of using a thick copper foil board is described. However, the present invention is not limited to only this example. Other boards such as a printed board manufactured by using general resin, and a metallic board may be used. In a case of the metallic board, an insulating substance may be provided between a base and each of the patterns.

In the above embodiments, an example in which the I-shaped lower core $2b$ is combined with the E-shaped upper core $2a$ is described. However, the present invention may be also applied to a magnetic device having two E-shaped cores which are combined with each other.

In the above embodiments, an example in which the present invention is applied to the magnetic devices 1 used as the choke coil L of the smoothing circuit 55 in the vehicle switching power supply apparatus 100 is described. However, the present invention may be also applied to a magnetic device used as the transformer 53 (FIG. 1). The present invention may be also applied to a magnetic device used in a switching power supply apparatus for, for example, electronic equipment in addition to a vehicle.

DESCRIPTION OF REFERENCE SIGN(S)

1 MAGNETIC DEVICE
$2a$ UPPER CORE
$2b$ LOWER CORE
3 BOARD
3L, $3m$, $3r$ OPENING PORTION
$4a$ TO $4e$ COIL PATTERN
$4g$, $4h$ HEAT-DISSIPATION PATTERN
$5a_7$ TO $5a_9$, $5b_7$ to $5b_9$ HEAT-DISSIPATION PATTERN
$7a$ TO $7f$ HEAT-DISSIPATION PIN
$8d$ THROUGH HOLE
$8c$ PAD
$9a$ TO $9d$ THROUGH HOLE
10 HEAT SINK
L1 FRONT-SIDE OUTER SURFACE LAYER
L2 INNER LAYER
L3 BACK-SIDE OUTER SURFACE LAYER

The invention claimed is:

1. A magnetic device comprising:
a core which is formed of a magnetic substance;
a board which is formed of an insulating substance, which has an opening portion into which the core is inserted, and which comprises first and second outer surface layers provided on both surfaces and an inner layer provided between the outer surface layers;
coil patterns which are formed of a conductor, and which are provided in the first and second outer surface layers and the inner layer of the board so as to be wound around the core;
a first heat-dissipation pattern which is formed of a conductor, which is provided to correspond to the coil pattern provided in the first outer surface layer of the board, and which is provided in the second outer surface layer;
a second heat-dissipation pattern which is formed of a conductor, which is provided to correspond to the coil pattern provided in the inner layer of the board, and which is provided in second the outer surface layer;
a first thermal inter-layer connection member which connects the coil pattern of the first outer surface layer and the first heat-dissipation pattern which correspond to each other; and
a second thermal inter-layer connection member which connects the coil pattern of the inner layer and the second heat-dissipation pattern which correspond to each other,
wherein the coil pattern provided in the second outer surface layer and the first and second heat-dissipation patterns are separated from each other, and
wherein an area of the second heat-dissipation pattern is larger than an area of the first heat-dissipation pattern.

2. The magnetic device according to claim 1,
wherein the first heat-dissipation pattern is separated from the second heat-dissipation pattern.

3. The magnetic device according to claim 1, further comprising:
An electrical inter-layer connection member which connects the coil patterns provided in different layers of the board with each other.

4. The magnetic device according to claim 1, further comprising:
a third heat-dissipation pattern which is formed of a conductor provided in the second outer surface layer of the board, and which is connected to the coil pattern provided in the second outer surface layer,
wherein the third heat-dissipation pattern and the first and second heat-dissipation patterns are separated from each other, and
wherein an area of the first heat-dissipation pattern is larger than an area of the third heat-dissipation pattern.

5. The magnetic device according to claim 1,
wherein the second heat-dissipation pattern is provided in the second outer surface layer of the board, and
a heat radiator is attached to the second outer surface layer.

* * * * *